(12) United States Patent
Collins et al.

(10) Patent No.: US 7,442,996 B2
(45) Date of Patent: Oct. 28, 2008

(54) STRUCTURE AND METHOD FOR ENHANCED TRIPLE WELL LATCHUP ROBUSTNESS

(75) Inventors: David S. Collins, Williston, VT (US); James A. Slinkman, Montpelier, VT (US); Steven H. Voldman, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 212 days.

(21) Appl. No.: 11/275,644

(22) Filed: Jan. 20, 2006

(65) Prior Publication Data
US 2006/0108642 A1 May 25, 2006
US 2007/0170515 A1 Jul. 26, 2007

(51) Int. Cl.
*H01L 29/76* (2006.01)
(52) U.S. Cl. .............. 257/371; 257/372; 257/E27.063
(58) Field of Classification Search ......... 257/371–374, 257/E27.063, E27.067
See application file for complete search history.

(56) References Cited

U.S. PATENT DOCUMENTS

| 5,470,766 | A |   | 11/1995 | Lien |
|---|---|---|---|---|
| 5,652,456 | A |   | 7/1997 | Lien |
| 5,668,755 | A |   | 9/1997 | Hidaka |
| 5,814,866 | A |   | 9/1998 | Borland |
| 5,880,014 | A | * | 3/1999 | Park et al. ............ 438/527 |
| 5,939,757 | A |   | 8/1999 | Kim |
| 6,107,672 | A |   | 8/2000 | Hirase |
| 6,114,729 | A |   | 9/2000 | Park et al. |
| 6,249,030 | B1 |  | 6/2001 | Lee |
| 6,258,641 | B1 | * | 7/2001 | Wong et al. ............ 438/199 |
| 6,300,209 | B1 |  | 10/2001 | Oh |

(Continued)

FOREIGN PATENT DOCUMENTS

EP 0831518 3/1998

(Continued)

OTHER PUBLICATIONS

Voldman, et al., "The Influence of Deep Trench and Substrate Resistance on the Latchup Robustness in a BICMOS Silicon Germanium Technology," Reliab. Phys. Symp. Proc. 42nd Annual, IEEE Int., Apr. 2004, pp. 135-142.

(Continued)

*Primary Examiner*—Tuan N. Quach
(74) *Attorney, Agent, or Firm*—Gibb & Rahman, LLC; Anthony Canale

(57) ABSTRACT

Disclosed is a triple well CMOS device structure that addresses the issue of latchup by adding an n+ buried layer not only beneath the p-well to isolate the p-well from the p-substrate but also beneath the n-well. The structure eliminates the spacing issues between the n-well and n+ buried layer by extending the n+ buried layer below the entire device. The structure also addresses the issue of threshold voltage scattering by providing a p+ buried layer below the entire device under the n+ buried layer or below the p-well side of the device only either under or above the n+ buried layer) Latchup robustness can further be improved by incorporating into the device an isolation structure that eliminates lateral pnp, npn, or pnpn devices and/or a sub-collector region between the n+ buried layer and the n-well.

14 Claims, 8 Drawing Sheets

U.S. PATENT DOCUMENTS

| | | | |
|---|---|---|---|
| 6,396,109 B1 * | 5/2002 | Hutter et al. | 257/372 |
| 6,531,363 B2 | 3/2003 | Uchida | |
| 6,593,178 B1 | 7/2003 | Lee | |
| 6,664,150 B2 | 12/2003 | Clark, Jr. et al. | |
| 6,664,608 B1 * | 12/2003 | Burr | 257/549 |
| 6,727,573 B2 | 4/2004 | Mitani et al. | |
| 6,767,780 B2 | 7/2004 | Sohn et al. | |
| 6,855,985 B2 | 2/2005 | Williams et al. | |
| 6,956,266 B1 * | 10/2005 | Voldman et al. | 257/371 |
| 6,975,015 B2 * | 12/2005 | Voldman et al. | 257/585 |
| 2002/0084506 A1 * | 7/2002 | Voldman et al. | 257/511 |
| 2003/0178622 A1 | 9/2003 | Wei et al. | |
| 2004/0135141 A1 | 7/2004 | Pequignot et al. | |
| 2004/0164354 A1 | 8/2004 | Mergens et al. | |

FOREIGN PATENT DOCUMENTS

| | | |
|---|---|---|
| JP | 05-267606 | 10/1993 |

OTHER PUBLICATIONS

Voldman, et al., "Latchup in Merged Triple Well Structure," Reliab. Phys. Symp. Proc. 43rd Annual, IEEE Int., Apr. 2005, pp. 129-136.

Voldman, et al, "The Influence of a Silicon Dioxide-Filled Trench Isolation Structure and Implanted Sub-Collector on Latchup Robustness," Reliab. Phys. Symp. Proc. 43rd Annual, IEEE Int., Apr. 2005, pp. 112-120.

* cited by examiner

STRUCTURE AND METHOD FOR ENHANCED TRIPLE WELL LATCHUP ROBUSTNESS

BACKGROUND

1. Field of the Invention

The embodiments of the invention generally relate to metal oxide semiconductor field effect transistor (MOSFET) devices, and, more particularly, to triple well technology in such MOSFET devices.

2. Description of the Related Art

Both noise isolation and the elimination of CMOS latchup are significant issues in advanced complementary metal oxide semiconductor (CMOS) technology and bipolar CMOS (BiCMOS) Silicon Germanium (SiGe) technology. More particularly, as MOSFET threshold voltages decrease, the need to isolate circuitry from noise sources becomes more important and has lead to an increased interest in "isolated MOSFETs" (i.e., triple well technology). In current triple well technology, a buried n-type layer (i.e., a buried n+ layer) is placed below the p-well and a buried p-type layer (i.e., a p+ layer) is placed below the n-well (or n-well/sub-collector combinations) at the same level, but not displaced. The buried n+ layer serves to isolate the p-well from the p− substrate. It was once believed that triple well technology would eliminate latchup. However, since in the process of isolating the p-well critical parameters that influence latchup robustness are modified, latchup remains a concern for the triple well technology in its current form. Additionally, because the buried n+ layer must overlap the n-wells in order to isolate the p-well, spacing issues present a problem in the current triple well CMOS formation process.

SUMMARY OF THE INVENTION

In view of the foregoing, embodiments of the invention provide a triple well CMOS device comprising a substrate with a first conductivity type (e.g., a p− substrate). Above the substrate is a first semiconductor layer with the first conductivity type (e.g., a buried p+ layer). Above the first semiconductor layer is a second semiconductor layer with a second conductivity type (e.g., an buried n+ layer). The CMOS device also comprises both a first semiconductor well with the second conductivity type (e.g., an n-well) and a second semiconductor well with the first conductivity type (e.g., a p-well or an isolated epitaxial p-type area) that are positioned adjacent to each other and above the second semiconductor layer such that the second semiconductor well is isolated from the substrate.

In one embodiment of the device the first and second semiconductor layers can each have the same defined dimensions (e.g., the same length) and can be directly aligned. For example, the first semiconductor layer can have first outer edges, the second semiconductor layer can have second outer edges, and the first outer edges can be aligned directly below the second outer edges. In another embodiment of the device the first semiconductor layer can comprise a blanket layer. The second semiconductor layer can have defined dimensions (e.g., a defined length) and, specifically, can have second outer edges that are positioned above the first semiconductor layer such that the first semiconductor layer extends laterally beyond the second outer edges. In yet another embodiment the first semiconductor layer can be placed either above or below the second semiconductor layer and can have defined dimensions (e.g., a defined length) with first outer edges. The first semiconductor layer and the second semiconductor layer can be positioned relative to each other such that at least one side of the second semiconductor layer extends laterally beyond one of the first outer edges of the first semiconductor layer. As with the previously described embodiments, in this embodiment both the first and second semiconductor wells are positioned above the second semiconductor layer. However, the first semiconductor well is positioned above that side of the second semiconductor layer that extends beyond the first semiconductor layer such that the second semiconductor well and not the first semiconductor well is positioned above the first semiconductor layer.

Thus, all three of the above-described embodiments of the invention address the issue of latchup by adding the second semiconductor layer (e.g., n+ layer) not only beneath the second semiconductor well (e.g., the p-well) but also beneath the first semiconductor well (e.g., the n-well). This n+ layer degrades the vertical pnp device lowering the vertical bipolar current gain of the pnp and reducing series shunt resistance of pnpn by lowering the n-well contact to p+ device resistance (i.e., the effective n-well shunt resistance). Additionally, all three of these embodiments eliminate the spacing issues by extending the n+ layer and address n-channel MOSFET threshold voltage scattering by providing the p+ layer.

Each of these embodiments of the device can also comprise an isolation structure (e.g., a trench isolation structure (TI) or a deep trench isolation structure (DT)) within the device that extends from a top surface of the device to below an upper surface of the second semiconductor layer such that it eliminates lateral devices and, thereby, improves latchup robustness. The isolation structure can either bifurcate the first semiconductor well or can separate the first semiconductor well from the second semiconductor well. If the isolation structure separates the first and second semiconductor wells, then that portion of the second semiconductor layer below the second semiconductor well must abut the isolation structure to ensure that the second semiconductor well is isolated from the substrate.

Each of these embodiments of the device can also comprise an additional isolation structure (e.g., either an additional trench isolation structure (TI) or an additional deep trench isolation structure (DT)) that surrounds the perimeter of the device in order to isolate the device from other devices on the substrate.

Lastly, each of these embodiments of the device can also comprise a sub-collector region having the second conductivity type between the first semiconductor well and the second semiconductor layer. The sub-collector region comprises a higher concentration of a second conductivity type dopant than either the first semiconductor well or the second semiconductor layer and further improves latchup robustness.

Embodiments of the method of forming the triple well CMOS device described above comprise forming a first semiconductor layer with the first conductivity type (e.g., a buried p+ layer) above a substrate with the same first conductivity type (e.g., a p− substrate). A second semiconductor layer with a second conductivity type (e.g., a buried n+ layer) is formed above the first semiconductor layer. A first semiconductor well with the second conductivity type (e.g., an n-well) is formed above the second semiconductor layer. Additionally, a second semiconductor well with the first conductivity type (e.g., a p-well) is formed adjacent to the first semiconductor well above the second semiconductor layer.

In one embodiment of the invention the first semiconductor layer can be formed with defined dimensions (e.g., a defined length) such that it has first outer edges. The second semiconductor layer can also be formed with the same defined dimensions and can have second outer edges that are aligned directly above the first outer edges. Thus, both the first semiconductor layer and the second semiconductor layer are positioned below both of the wells. Similarly, in another embodiment of the invention, the first semiconductor layer can be formed as a blanket layer and the second semiconductor layer can be formed with defined dimensions (e.g., a defined length) such that it has second outer edges. The second outer edges can be positioned above the blanket layer such that both the first semiconductor layer and the second semiconductor layer are positioned below both of the wells. In yet another embodiment of the invention, the first semiconductor layer can be formed with defined dimensions (e.g., a defined length) and, specifically, can be formed with first outer edges. The second semiconductor layer of this embodiment can be formed above the first semiconductor layer such that at least one side of the second semiconductor layer extends laterally beyond one of the first outer edges of the first semiconductor layer. In this embodiment both the first and second semiconductor wells are formed above the second semiconductor layer. However, the first semiconductor well is formed on that side of the second semiconductor layer that extends beyond the first semiconductor layer such that only the second semiconductor well is positioned above the first semiconductor layer.

Additionally, the method can comprise forming an isolation structure that extends from a top surface of the device to below an upper surface of the second semiconductor layer so as to eliminate lateral devices and, thereby, improve latchup robustness. The isolation structure can be formed to bifurcate the first semiconductor well. Alternatively, the isolation structure can be formed to separate the first semiconductor well and the second semiconductor well. However, if the isolation structure separates the first and second semiconductor wells, it must further be formed such that a portion of the second semiconductor layer below the second semiconductor well abuts the isolation structure in order to isolate the second semiconductor well from the substrate. This isolation structure can be formed as either a trench isolation structure (TI) that extends from the top surface of the device to below the upper surface of the second semiconductor layer but above the level of the first semiconductor layer. Alternatively, this isolation structure can be formed as a deep trench isolation structure (DT) that extends from the top surface of device into the substrate below the level of the first semiconductor layer.

The method can also comprise forming an additional isolation structure around the perimeter of the device, simultaneously with forming the above-described isolation structure. This additional isolation structure can isolate the device from other devices formed on the same substrate.

To further improve latchup robustness within the device, the method can comprise before forming the first semiconductor well, forming a sub-collector region with the second conductivity type above one side of the second semiconductor layer and then, forming the first semiconductor well above the sub-collector region.

These and other aspects of the embodiments of the invention will be better appreciated and understood when considered in conjunction with the following description and the accompanying drawings. It should be understood, however, that the following descriptions, while indicating embodiments of the invention and numerous specific details thereof, are given by way of illustration and not of limitation. Many changes and modifications may be made within the scope of the embodiments of the invention without departing from the spirit thereof, and the embodiments of the invention include all such modifications.

BRIEF DESCRIPTION OF THE DRAWINGS

The embodiments of the invention will be better understood from the following detailed description with reference to the drawings, in which:

FIG. 9 is a schematic diagram illustrating additional features incorporated into the structure of FIG. 4a;

FIG. 10 is a schematic diagram illustrating additional features incorporated into the structure of FIG. 4a;

FIG. 11 is a schematic diagram illustrating additional features incorporated into the structure of FIG. 4a;

FIG. 12 is a schematic diagram illustrating additional features incorporated into the structure of FIG. 4a.

DETAILED DESCRIPTION OF PREFERRED EMBODIMENTS

Figure 1:
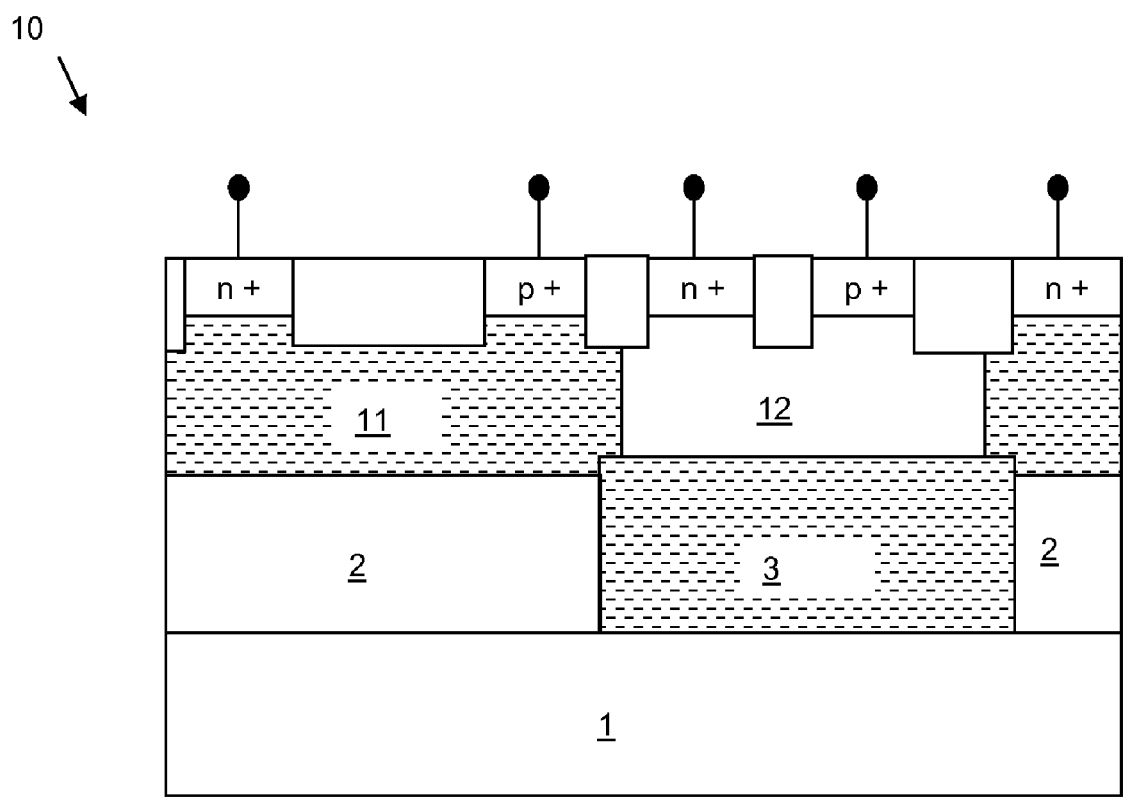
FIG. 1 is a schematic diagram illustrating a cross-section view of a triple well CMOS structure.

The embodiments of the invention and the various features and advantageous details thereof are explained more fully with reference to the non-limiting embodiments that are illustrated in the accompanying drawings and detailed in the following description. It should be noted that the features illustrated in the drawings are not necessarily drawn to scale. Descriptions of well-known components and processing techniques are omitted so as to not unnecessarily obscure the embodiments of the invention. The examples used herein are intended merely to facilitate an understanding of ways in which the embodiments of the invention may be practiced and to further enable those of skill in the art to practice the embodiments of the invention. Accordingly, the examples should not be construed as limiting the scope of the embodiments of the invention.

As mentioned above, and referring to FIG. 1, CMOS devices 10 that are formed using current state of the art triple well technology typically comprise a buried n+ layer 3 placed below the p-well 12 and a buried p+ layer 2 placed below the n-well 11 (or n-well/sub-collector combinations) at the same level as the n+ layer 3, but not displaced. The p+ layer 2 compensates for n-channel MOSFET threshold voltage scattering. The n+ layer 3 serves to isolate the p-well 12 from the p− substrate 1 and, thereby, improves the latchup robustness under the n-well 11. However, while it was once believed that triple well technology would eliminate latchup, latchup remains a concern for the triple well technology in its current form (e.g., as illustrated in FIG. 1). Specifically, in the process of isolating the p-well 12, critical parameters that influence latchup robustness are modified. Namely, the p+ layer 2 creates a low-resistance collector vertical pnp bipolar transistor and the n+ layer 3 creates a high npn bipolar current gain. These vertical devices, when cross-coupled together, cause an increase in the bipolar current gain product. Thus, CMOS latchup is still a concern with current triple well technology.

More particularly, by using triple well technology the pnp parasitic current gain can be significantly reduced below the base dual well CMOS levels. Additionally, the addition of the n-type buried layer 3 increases the npn bipolar current gain. The reduction of the pnp bipolar current gain is a function of the buried layer design, but the increase in the npn bipolar current gain is inevitable because of the placement of the buried n-layer 3 under the p-well 12 of the n-channel MOSFET structure. The reduction of one bipolar current gain and the enhancement of the second bipolar current gain changes the relationships, as well as the sensitivity of the undershoot and the overshoot.

Latchup occurs in CMOS technology when a semiconductor pnpn network undergoes regenerative feedback between the parasitic pnp and npn bipolar current gain. A first criteria is that the pnp and npn bipolar transistors must be in forward active. A second criteria for CMOS latchup is when the following inequality is satisfied, $$\beta_n \beta_p \geq \frac{1 + I_{sx} \beta_n}{\left[ 1 - I_w \frac{(\beta_n + 1)}{\beta_n} - I_{sx} \right]}$$

where $$I_w = \frac{(V_{BE})_{pnp}}{R_w} = \frac{V_O}{R_w} \ln\left[ \frac{1 - I_w}{(I_o)_p} \right]$$

and $$I_{sx} = \frac{(V_{BE})_{npn}}{R_{sx}} = \frac{V_O}{R_{sx}} \ln\left[ \frac{1 - I_{sx}}{(I_o)_n} \right]$$

when CMOS latchup is initiated the holding current condition can be expressed as $$I_H = \frac{\beta_p(\beta_n + 1)I_w + (\beta_p + 1)\beta_n I_{sx}}{\beta_p \beta_n - 1}$$

In the case where the npn current gain is significantly increased, $$I_H|_{\beta_n \gg 1} \cong I_w + \left( \frac{\beta_p + 1}{\beta_p} \right) I_{sx}$$

and the complimentary case, $$I_H|_{\beta_p \gg 1} \cong I_{sx} + \left( \frac{\beta_n + 1}{\beta_n} \right) I_w.$$

Thus, for the device of FIG. 1, the pnp bipolar current gain is significantly reduced below unity, the npn bipolar current gain is greater than unity, and the product of the bipolar current gain is greater than one.

$$I_H \approx \left( \frac{1}{\beta_p} \right) I_{sx} + \left( \frac{\beta_n + 1}{\beta_n} \right) I_w$$

Hence, the symmetry of the product of the bipolar current gains in the triple well structure is distinct from the dual well bipolar current gain symmetry. In advanced CMOS, typically the npn bipolar current gain is higher than the pnp bipolar current gain; in merged triple well structures, as illustrated in FIG. 1, this asymmetry of bipolar gains is further enhanced with a greater difference between the npn and the pnp bipolar transistor. As a result, the triple well process may be more sensitive to the negative undershoot phenomena, but less sensitive to the positive overshoot phenomena. A very important advantage of the merged triple well structure over dual-well CMOS is that the latchup phenomena is not a strong function of the substrate doping concentration but a function of the p-well and the n-type isolation layer design choices. In the scaling of CMOS, RF CMOS, and BiCMOS technology, higher substrate doping concentrations can be used to further decrease the noise concern between digital, analog and RF circuits and sub-functions. Additionally, the electrical isolation of the n-channel MOSFETs from the substrate can also reduce the effects from single event latchup (SEL) from ionizing radiation sources, heavy ions and alpha particles (see references [1-7]). The isolation from the substrate makes the merged triple well less sensitive to other sources of minority carrier injection into the substrate, such as Cable Discharge Events (CDE) (see references [8-13]). Thus, the triple well structure has advantages over the dual well structure; however, structural solutions are needed to improve the latchup robustness of this triple well structure. Additionally, because the n-layer 3 must overlap the n-well 11 in order to isolate the p-well 12 spacing issues present problems in the current triple well formation process.

In view of the foregoing, disclosed herein is a triple well CMOS device structure that addresses the issue of latchup by adding an n+buried layer not only beneath the p-well to isolate the p-well from the p− substrate but also beneath the n-wells. This n+ buried layer degrades the vertical pnp bipolar current gain. The structure eliminates the spacing issues between the n-well and n+ buried layer during the formation process by extending the n+ buried layer below the entire device and not just the p-well. The structure also addresses the issue of threshold voltage scattering by providing a p+ buried layer below the entire device under the n+ buried layer or below the p-well side of the device either under or above the n+ buried layer.

Figure 2:
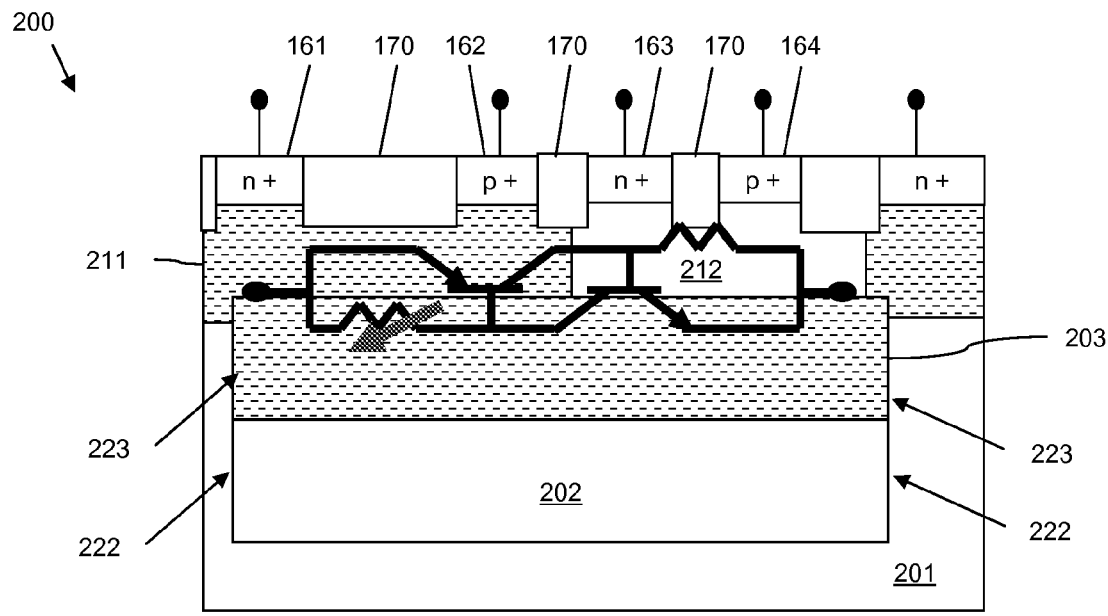
FIG. 2 is a schematic diagram illustrating a cross-section view of an embodiment of a triple well CMOS structure of the invention.
Figure 3:
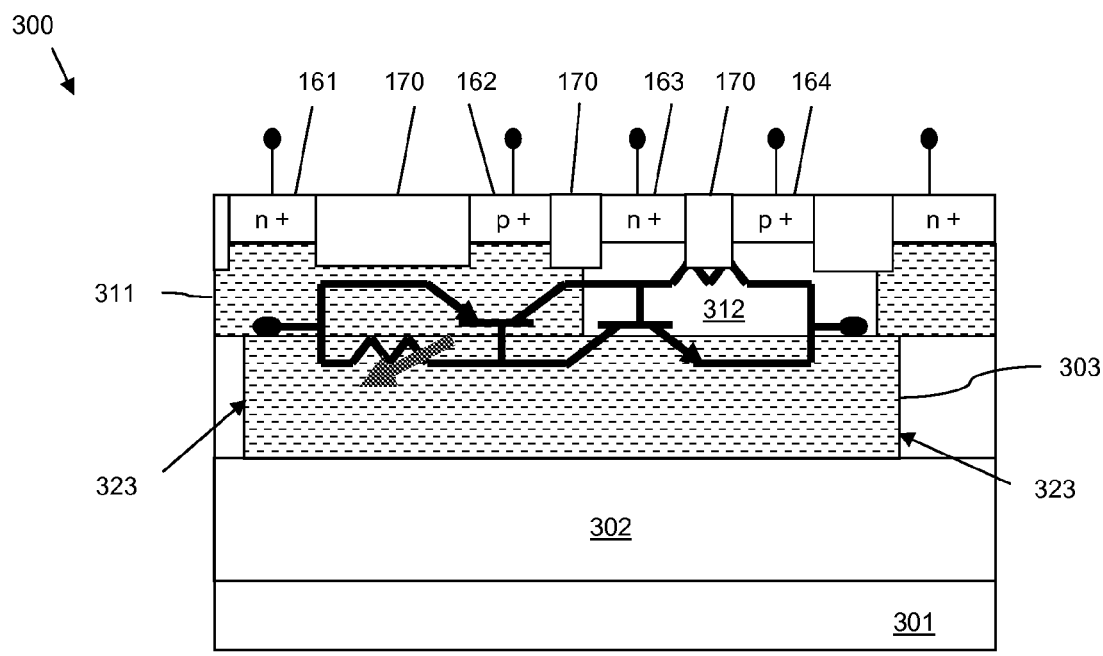
FIG. 3 is a schematic diagram illustrating a cross-section view of another embodiment of a triple well CMOS structure of the invention.

FIGS. 2-4 illustrate three embodiments of the triple well CMOS device of the invention.

FIG. 2 provides a triple well CMOS device 200 comprising a substrate 201, with a first conductivity type (e.g., a low-doped p-type substrate (i.e., p− substrate)). Above the substrate 201 is a first semiconductor layer 202 also with this first conductivity type (e.g., a high-doped p-type layer (i.e., a buried p+ layer)). Above the first semiconductor layer 202 is a second semiconductor layer 203 with a second conductivity type (e.g., a high-doped n-type layer (i.e., a buried n+ layer). Above the second semiconductor layer 203 is a first semiconductor well 211 with the second conductivity type (e.g., an n-well) and a second semiconductor well 212 with the first conductivity type (e.g., a p-well or an isolated expitaxial p-type region). In this particular embodiment of the invention, the first semiconductor layer 202 can have the same dimensions and particularly, the same length as the second semiconductor layer 203. For example, the first semiconductor layer 202 can have first outer edges 222, the second semiconductor layer 203 can have second outer edges 223, and the first outer edges 222 can be aligned directly below the second outer edges 223.

As with the prior art triple well technology, the primary function of the first semiconductor layer 202 is to compensate for n-channel MOSFET threshold voltage scattering and the primary function of the second semiconductor layer 203 is to isolate the second semiconductor well 212 from the substrate 201. Additionally, this embodiment creates a high capacitance triple well capacitor with the first 202 and second 203 semiconductor layers. It also provides a high-doping to low-doping interface (e.g., p+ layer to p– substrate interface) between the first semiconductor layer 202 and the substrate 201 having the same conductivity type and creates a low shunt resistance. This interface prevents minority carrier collection in the first semiconductor well (e.g., n-well) for external latchup.

FIG. 3 provides a triple well CMOS device 300 comprising a substrate 301, with a first conductivity type (e.g., a low-doped p-type substrate (i.e., p– substrate)). Above the substrate 301 is a first semiconductor layer 302 also with this first conductivity type (e.g., a high-doped p-type layer (i.e., a buried p+ layer)). Above the first semiconductor layer 302 is a second semiconductor layer 303 with a second conductivity type (e.g., a high-doped n-type layer (i.e., a buried n+ layer). Above the second semiconductor layer 303 is a first semiconductor well 311 with the second conductivity type (e.g., an n-well) and a second semiconductor well 312 with the first conductivity type (e.g., a p-well or an isolated expitaxial p-type region). In this particular embodiment of the invention, the first semiconductor layer 302 can be longer than the second semiconductor layer 303. For example, the first semiconductor layer 302 can comprise a blanket layer over the substrate 301. The second semiconductor layer 303 can have defined dimensions and, particularly, a defined length with second outer edges 323 above the blanket layer such that the first semiconductor layer 302 extends laterally beyond the second outer edges 323.

As with the prior art triple well technology, the primary function of the first semiconductor layer 302 is to compensate for n-channel MOSFET threshold voltage scattering and the primary function of the second semiconductor layer 303 is to isolate the second semiconductor well 312 from the substrate 301. Additionally, as with the embodiment illustrated in FIG. 2, this embodiment creates a high capacitance triple well capacitor with the first 302 and second 303 semiconductor layers. It also provides a high-doping to low-doping interface (e.g., p+ layer to p– substrate interface) between the first semiconductor layer 302 and the substrate 301 having the same conductivity type and creates a low shunt resistance. This interface prevents minority carrier collection in the first semiconductor well (e.g., n-well) for external latchup.

Figure 4A:
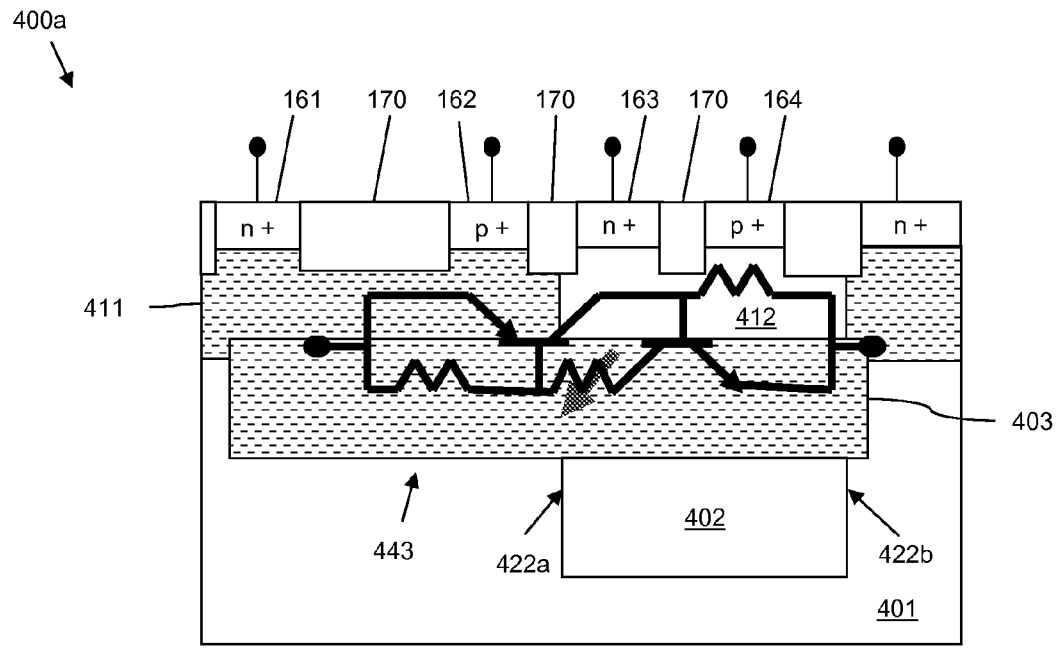
FIGS. 4a-4b are schematic diagrams illustrating cross-section views of another embodiment of a triple well CMOS structure of the invention.
Figure 4B:
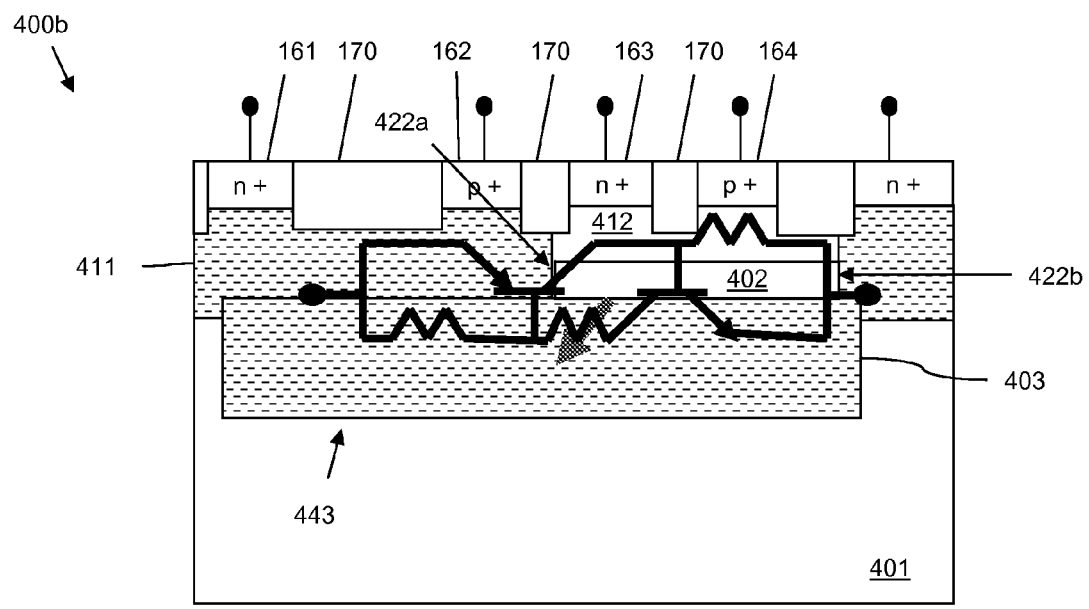

FIGS. 4a and 4b illustrate another embodiment of the triple well CMOS device structure of the invention. Each of the devices 400a of FIG. 4a and 400b of FIG. 4b comprise a substrate with a first conductivity type (e.g., a low-doped p-type substrate (i.e., p– substrate)). Above the substrate 401 are both a first semiconductor layer 402 with this first conductivity type (e.g., a high-doped p-type layer (i.e., a buried p+ layer)) and a second semiconductor layer 403 with a second conductivity type (e.g., a high-doped n-type layer (i.e., a buried n+ layer). Both a first semiconductor well 411 with the second conductivity type (e.g., an n-well) and a second semiconductor well 412 with the first conductivity type (e.g., a p-well or an isolated expitaxial p-type region) are positioned above the second semiconductor layer 403. However, in this particular embodiment of the invention, the first semiconductor layer 402 can be positioned either below the second semiconductor layer 403 (as illustrated in device 400a of FIG. 4a) or above the second semiconductor layer 403 (as illustrated in device 400b of FIG. 4b). The first semiconductor layer 402 has defined dimensions (e.g., a defined length) with first outer edges 422a-b. Regardless of whether the first semiconductor layer 402 is above or below the second semiconductor layer 403, one side 443 of the second semiconductor layer 403 extends laterally beyond one of the first outer edges (e.g., first outer edge 422a) of the first semiconductor layer 402. Additionally, the first semiconductor well 411 is positioned on that side 443 of the second semiconductor layer 403 that extends beyond the first semiconductor layer 402 such that the second semiconductor well 412 and not the first semiconductor well 411 is positioned above the first semiconductor layer 402.

As with the prior art triple well technology, the primary function of the first semiconductor layer 402 is to compensate for n-channel MOSFET threshold voltage scattering and the primary function of the second semiconductor layer 403 is to isolate the second semiconductor well 412 from the substrate 401. This embodiment creates a low resistance region on the first semiconductor well 411 side of the device 400 and a lower pnp gain characteristic. This embodiment also allows for an increase in the collector resistance of the vertical npn transistor on the second semiconductor well 412 side of the device by increasing the sheet resistance of the n+ layer 403 under the isolated p-well 412. Additionally, the p+ layer 402 below the p-well compensates for n-channel MOSFET threshold voltage scattering.

The CMOS devices 200, 300, and 400a-b, described above, can further comprise a first n+ diffusion region 161 and a first p+ diffusion region 162 above the first semiconductor well 211, 311, 411 and a second n+ diffusion region 163 and a second p+ diffusion region 164 above the second semiconductor well 212, 312, 412. The first n+ diffusion region 161 can represent a contact to the n-well. The first p+ diffusion region 162 can represent any p+ device, e.g., a p+ diode, a p-FET, a bipolar transistor, a p-doped resistor, etc. The second n+ diffusion region 163 can represent any n+ device, e.g., an n+ diode, an n-FET, a bipolar transistor, an n-doped resistor, etc. The second p+ diffusion region 164 can represent a contact to the p-well 212, 312, 412. Each of diffusion regions 161-164 may be separated by shallow trench isolation structures (STI) 170 (e.g., insulator-filled trenches that extend into the wells just below the diffusion regions 161-164).

Thus, all three of the above-described embodiments of the invention (devices 200, 300, and 400a-b) address the issue of latchup by adding the second semiconductor layer 203, 303, 403 (n+ layer) not only beneath the second semiconductor well 212, 312, 412 (p-well) but also beneath the first semiconductor well 211, 311, 411 (n-well). This second semiconductor layer 203, 303, 403 (n+ layer) degrades the vertical pnp bipolar current gain and also lowers the n-well contact to p+ device shunt resistance. Additionally, all three of these embodiments eliminate the spacing issues between the n-well 211, 311, 411 and the n+ layer 203, 303, 403 by extending the n+ layer below the entire device. These embodiments also address n-channel MOSFET threshold voltage scattering by providing the p+ layer 202, 302, 402.

It should be understood that while the first conductivity type is described herein for illustration purposes as a p-type conductivity and the second conductivity type is described herein for illustration purposes as an n-type conductivity, the reverse conductivity is also anticipated. Additionally, those skilled in the art will recognize that the semiconductor layers and wells of the invention may be doped with appropriate dopants at appropriate concentrations suitable to achieve the desired conductivity type and doping-level. For example, a p−substrate, a p+ layer, and a p-well may each be doped with a suitable p-type dopant, such as, Boron. Alternatively, an n+ layer, an n-well, and an n-type sub-collector region may each be doped with a suitable n-type dopant, such as, Phosphorus, Arsenic or Antimony.

In addition to the features described above, each of these above-described embodiments of the invention can also comprise an isolation structure that extends from the top surface of the device to below an upper surface of the second semiconductor layer serves to eliminate all lateral devices (e.g., lateral npn, pnp, or pnpn devices) and, thereby, improve latchup robustness. Specifically, this isolation structure can be a trench isolation structure (TI) (e.g., an insulator-filled trench such as a back end of line (BEOL) BPSG or PSG inter-level dielectric-filled trench) that extends from the top surface of the device to below the upper surface of the second semiconductor layer. Alternatively, this isolation structure can be a deep trench isolation structure (DT) (e.g., an oxide or other insulator-lined trench filled with a semiconductor material, such as polysilicon) that extends from the top surface of the device just below the STI structures 161-164 into the substrate below the level of the first semiconductor layer. Additionally, this isolation structure can either bifurcate the first semiconductor well or separate the first and second semiconductor wells. If the isolation structure separates the first and second semiconductor wells, then a portion of the second semiconductor layer below the second semiconductor well must abut the isolation structure. For example, FIGS. 5-8 illustrate an isolation structure incorporated into device 300 of FIG. 3 and FIGS. 9-12 illustrate an isolation structure incorporated into a device 400a of FIG. 4a. While such isolation structures are not specifically illustrated for device 200 of FIG. 2, those skilled in the art will recognize that due to the similarity of the devices 200 and 300, the configuration would be the same as illustrated in FIGS. 5-8. Similarly, while such isolation structures are not specifically illustrated for device 400b of FIG. 4b, those skilled in the art will recognize that due to the similarity of the devices 400a and 400b, the configuration would be the same as illustrated in FIGS. 9-12.

Figure 5:
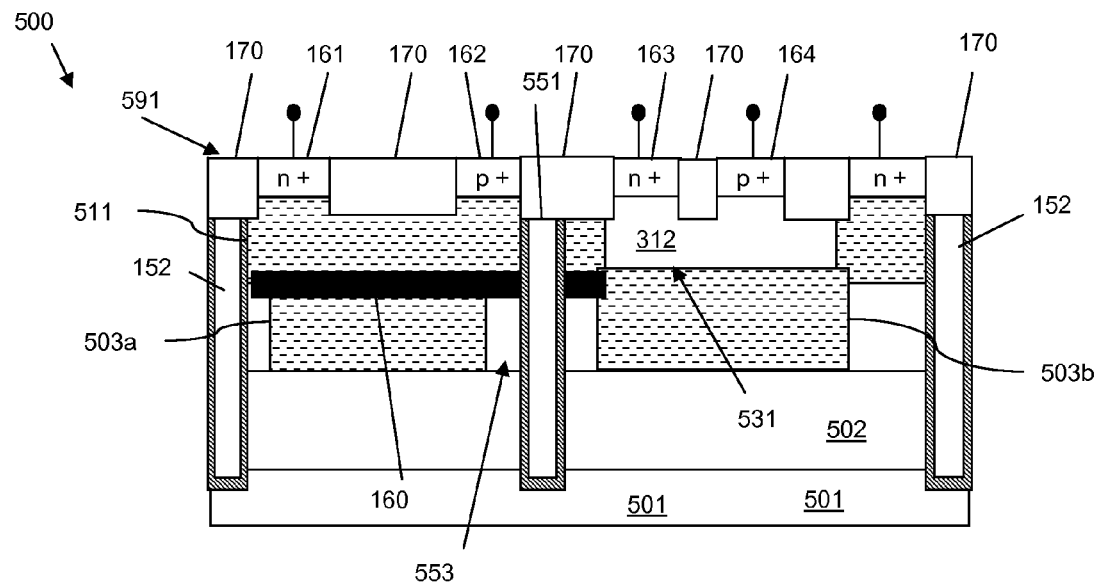
FIG. 5 is a schematic diagram illustrating additional features incorporated into the structure of FIG. 3.

More particularly, FIG. 5 illustrates an isolation structure 551 incorporated into the device 300 of FIG. 3. The isolation structure 551 comprises a deep trench isolation structure (DT) that extends from the top surface 591 of the device 500 just below a shallow trench isolation structure (STI) 170 to below the upper surface 531 of the second semiconductor layer 503 through the first semiconductor layer 502 and into the substrate 501. The isolation structure 551 bifurcates the first semiconductor well 511. As illustrated, the second semiconductor layer 503 comprises two discrete portions 503a and 503b separated by a gap 553 such that it extends into the substrate 501 without contacting the second semiconductor layer 503. However, it is anticipated that either one or both portions 503a-b of the second semiconductor layer may abut the isolation structure 551.

Figure 6:
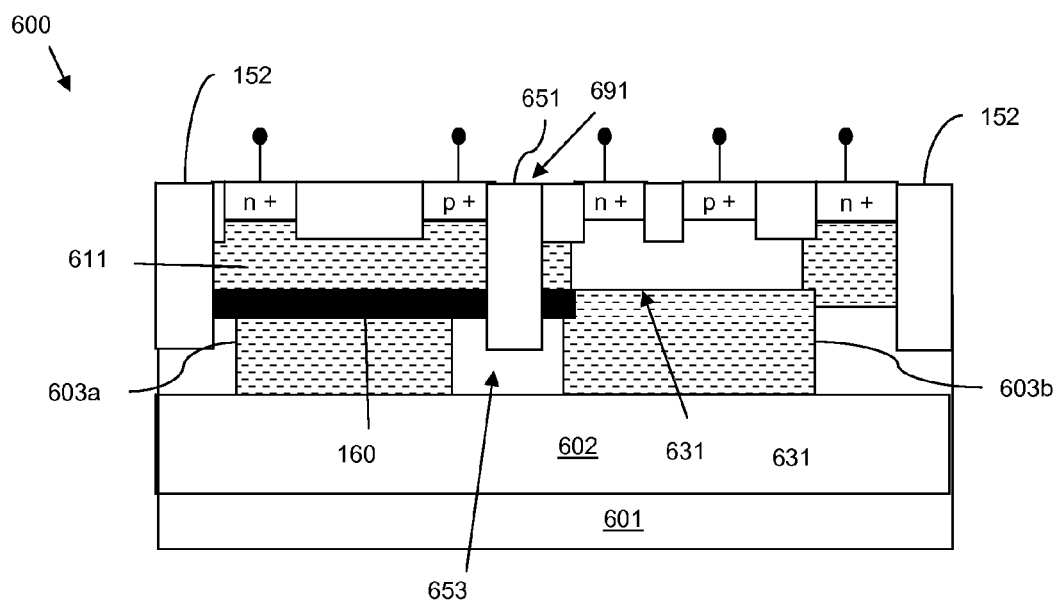
FIG. 6 is a schematic diagram illustrating additional features incorporated into the structure of FIG. 3.

FIG. 6 illustrates an isolation structure 651 incorporated into the device 300 of FIG. 3. The isolation structure 651 comprises a trench isolation structure (TI) that extends from the top surface 691 of the device 600 to below an upper surface 631 of the second semiconductor layer 603, but above the level of the first semiconductor layer 602. The isolation structure 651 bifurcates the first semiconductor well 611. As illustrated, the second semiconductor layer 603 comprises two discrete portions 603a and 603b separated by a gap 653 such that the isolation structure 651 extends between the portions 603a-b but does contact them. However, it is anticipated that either one or both portions 603a-b of the second semiconductor layer may abut the isolation structure 651.

Figure 7:
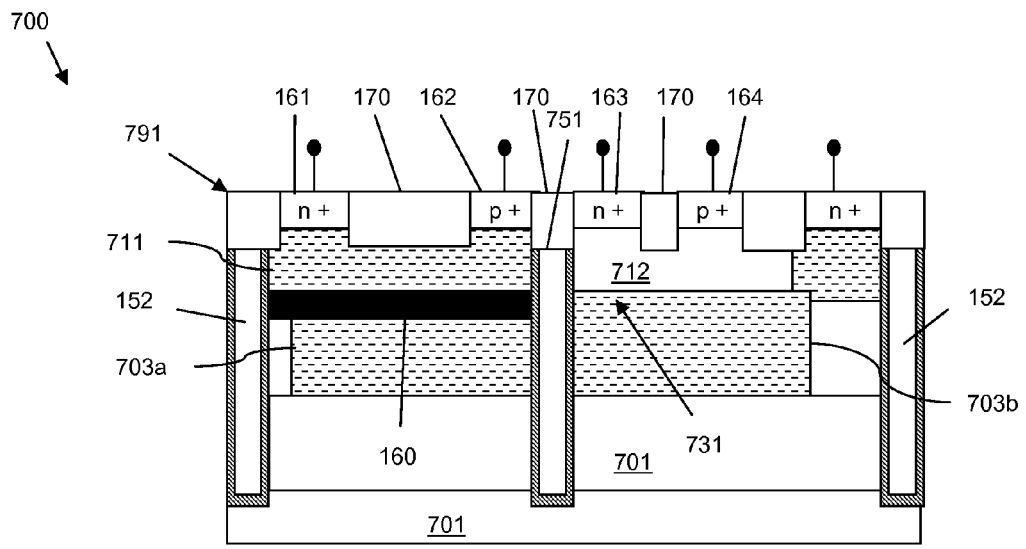
FIG. 7 is a schematic diagram illustrating additional features incorporated into the structure of FIG. 3.

FIG. 7 illustrates an isolation structure 751 incorporated into the device 300 of FIG. 3. The isolation structure 751 comprises a deep trench isolation structure (DT) that extends from the top surface 791 of the device 700 just below a shallow trench isolation structure (STI) 170 to below the upper surface 731 of the second semiconductor layer 703 through the first semiconductor layer 702 and into the substrate 701. The isolation structure 551 separates the first semiconductor well 711 from the second semiconductor well 712. To ensure that the second semiconductor well 712 remains isolated from the substrate 701 that portion 703b of the second semiconductor layer 703 that is positioned below the second semiconductor well 712 abuts the isolation structure 751. While FIG. 7 illustrates both portions 703a and 703b abutting the isolation structure, it is understood that this is not required of portion 703a.

Figure 8:
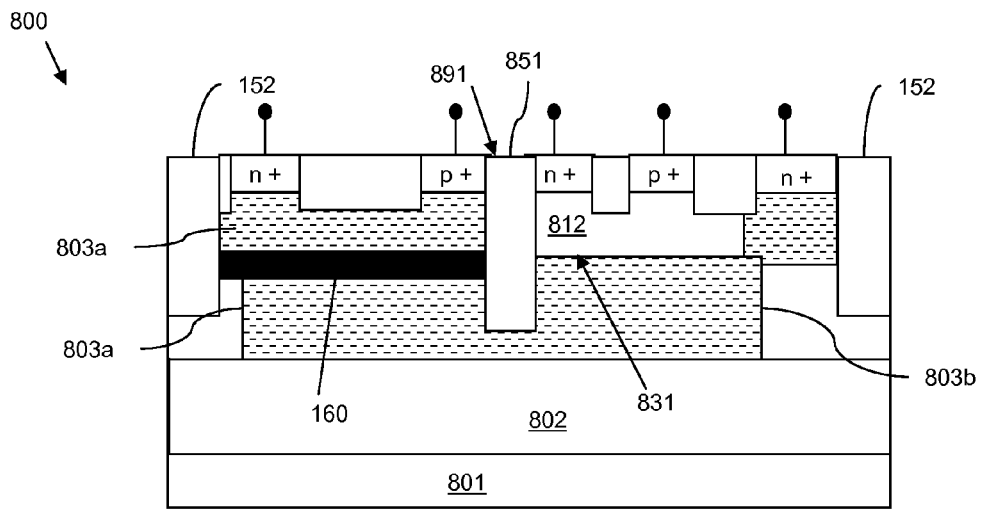
FIG. 8 is a schematic diagram illustrating additional features incorporated into the structure of FIG. 3.

FIG. 8 illustrates an isolation structure 851 incorporated into the device 300 of FIG. 3. The isolation structure 851 comprises a trench isolation structure (TI) that extends from the top surface 891 of the device 800 to below an upper surface 831 of the second semiconductor layer 803 but above the level of the first semiconductor layer 802. The isolation structure 851 separates the first semiconductor well 811 from the second semiconductor well 812. To ensure that the second semiconductor well 812 remains isolated from the substrate 801 that portion 803b of the second semiconductor layer 803a-b that is positioned below the second semiconductor well 812 abuts the isolation structure 851. While FIG. 8 illustrates both portions 803a and 803b abutting the isolation structure, it is understood that this is not required of portion 803a.

Figure 9:
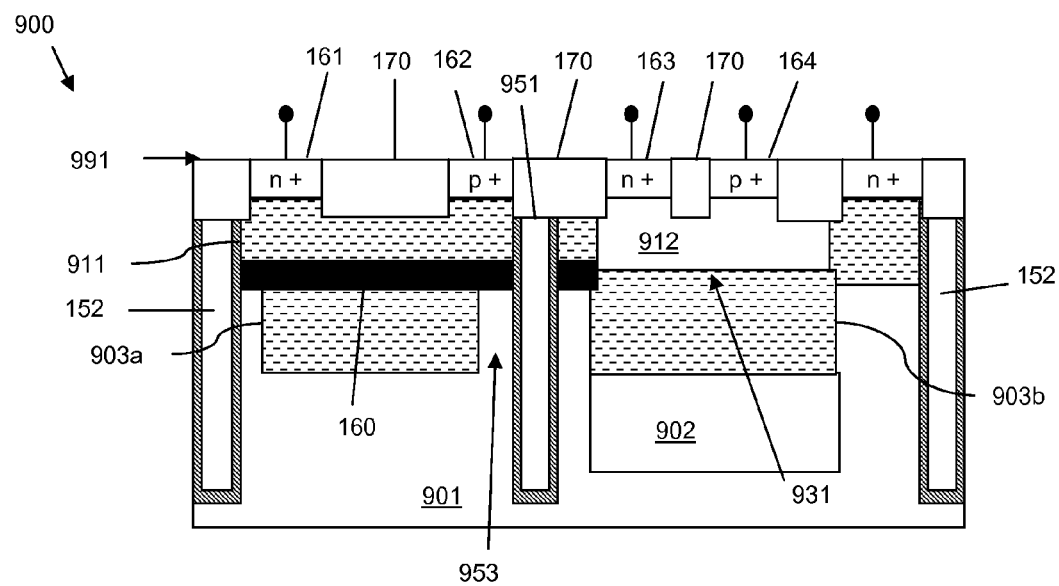

FIG. 9 illustrates an isolation structure 951 incorporated into the device 400a of FIG. 4a. The isolation structure 951 comprises a deep trench isolation structure (DT) that extends from the top surface 991 of the device 900 just below a shallow trench isolation structure (STI) 170 to below the upper surface 931 of the second semiconductor layer 903 adjacent to the first semiconductor layer 902 and into the substrate 901 below the level of the first semiconductor layer 902. The isolation structure 951 bifurcates the first semiconductor well 911. As illustrated, the second semiconductor layer 903 comprises two discrete portions 903a and 903b separated by a gap 953 such that the isolation structure 951 extends into the substrate without contacting the second semiconductor layer 903. However, it is anticipated that either one or both portions 903a-b of the second semiconductor layer may abut the isolation structure 951.

Figure 10:
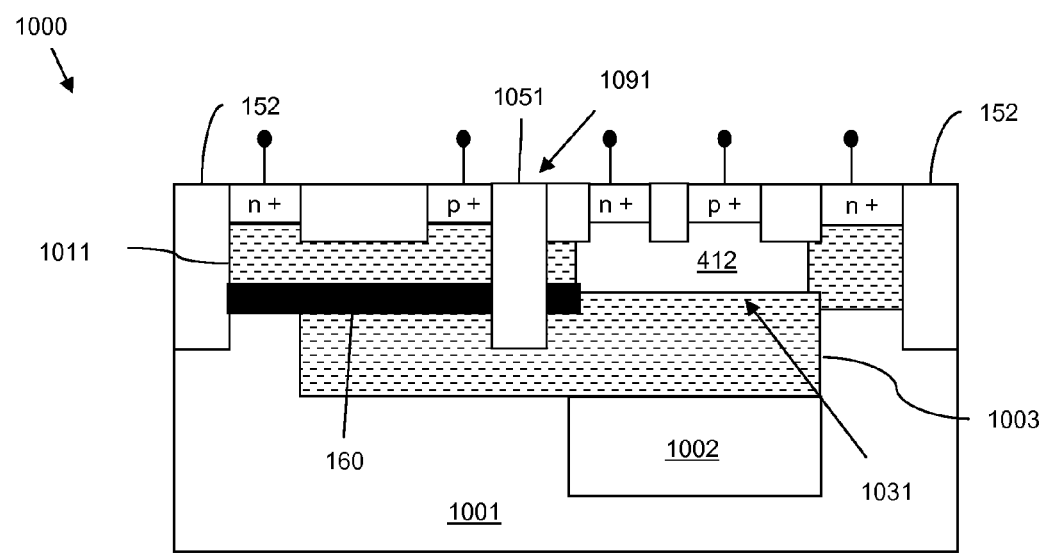

FIG. 10 illustrates an isolation structure 1051 incorporated into the device 400a of FIG. 4a. The isolation structure 1051 comprises a trench isolation structure (TI) that extends from the top surface 1091 of the device 1000 to below an upper surface 1031 of the second semiconductor layer 1003 but above an upper surface of the first semiconductor layer 1002. The isolation structure 1051 bifurcates the first semiconductor well 1011. As illustrated, the isolation trench 1051 contacts the second semiconductor layer 1003. However, it is understood that the semiconductor layer 1003 could comprises two discrete portions separated by a gap such that the isolation structure 1051 extends between the portions but does contact them.

Figure 11:
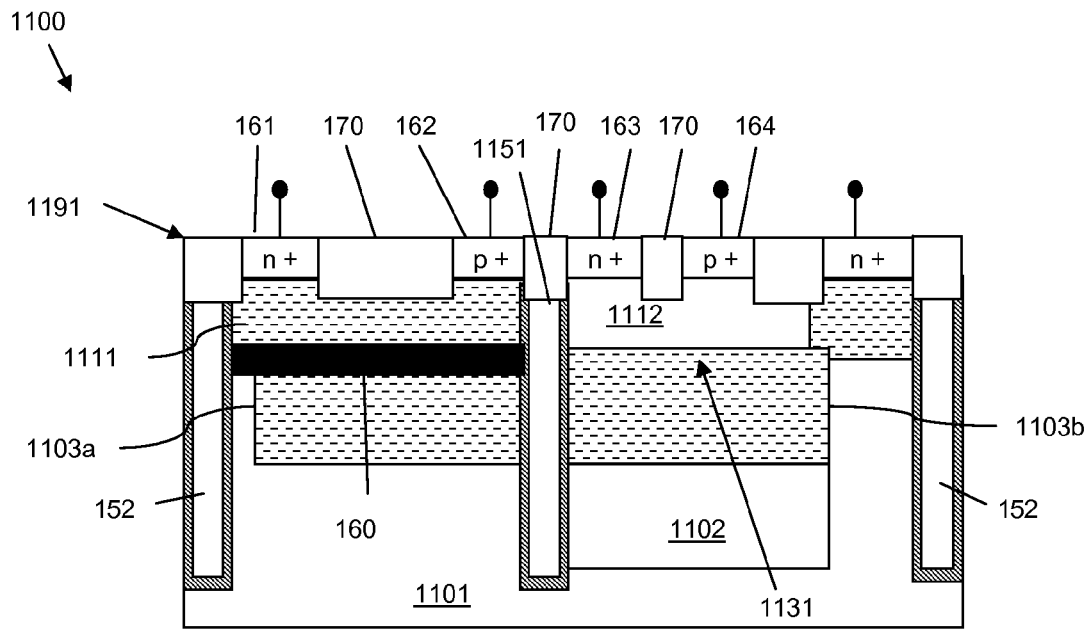

FIG. 11 illustrates an isolation structure 1151 incorporated into the device 400a of FIG. 4a. The isolation structure 1151 comprises a deep trench isolation structure (DT) that extends from the top surface 1191 of the device 1100 just below a shallow trench isolation structure (STI) 170 to below the upper surface 1131 of the second semiconductor layer 703 adjacent to first semiconductor layer 1102 and into the substrate 1101. The isolation structure 1151 separates the first semiconductor well 1111 from the second semiconductor well 1112. To ensure that the second semiconductor well 1112 remains isolated from the substrate 1101, that portion 1103b of the second semiconductor layer 1103a-b that is positioned below the second semiconductor well 1112 abuts the isolation structure 751. While FIG. 11 illustrates both portions 1103a and 1103b abutting the isolation structure, it is understood that this is not required of portion 1103a.

Figure 12:
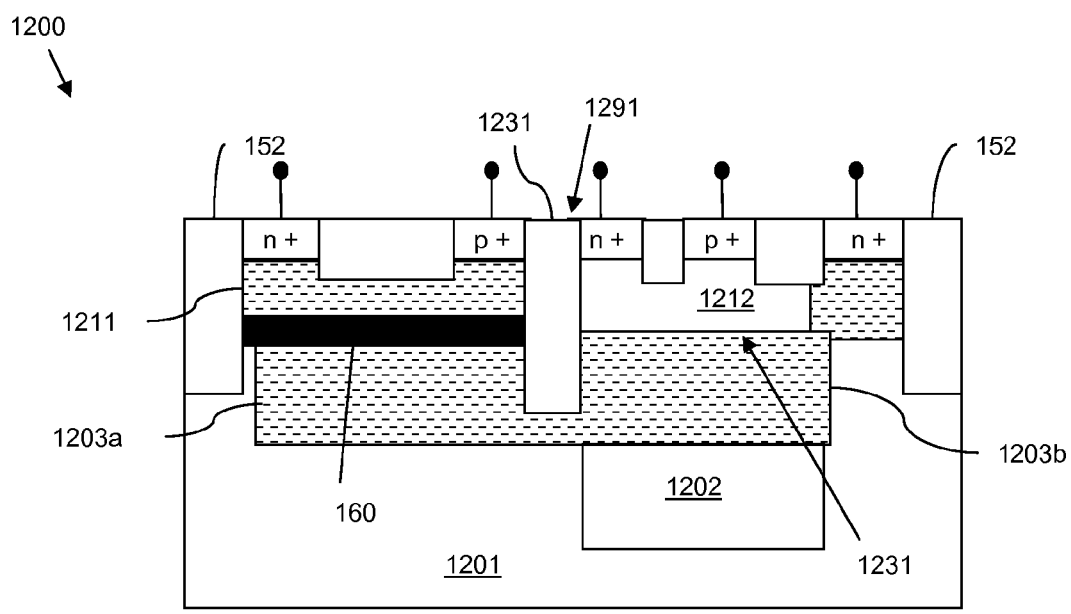

FIG. 12 illustrates an isolation structure 1251 incorporated into the device 400a of FIG. 4a. The isolation structure 1251 comprises a trench isolation structure (TI) that extends from the top surface 1291 of the device 1200 to below an upper surface 1231 of the second semiconductor layer 1203, but above the level of the first semiconductor layer 1202. The isolation structure 1251 separates the first semiconductor well 1211 from the second semiconductor well 1212. To ensure that the second semiconductor well 1212 remains isolated from the substrate 1201, that portion 1203b of the second semiconductor layer 1203a-b that is positioned below the second semiconductor well 1212 abuts the isolation structure 1251. While FIG. 12 illustrates both portions 1203a and 1203b abutting the isolation structure 1251, it is understood that this is not required of portion 1203a.

The type of isolation structure used can be a function of the type of wafer technology used to form the device and, particularly, a function of the thickness of the wafer.

Each of the above-described embodiments of the invention can also comprise an additional isolation structure 152. For example, the additional isolation structure 152 can be either an additional trench isolation structure (TI) (see FIGS. 6, 8, 10, and 12) that extends from the top surface of the device to below an upper surface of the second semiconductor layer or an additional deep trench isolation structure (DT) (see FIGS. 5, 7, 9, and 11) that extends from the top surface of the device just below a shallow trench isolation structure (STI) into the substrate. This additional isolation structure 152 can surround the perimeter of the device in order to isolate the device from other devices on the substrate.

Lastly, each of the above-described embodiments of the invention can also comprise a sub-collector region 160 positioned between the first semiconductor well and the second semiconductor layer. For example, as illustrated in FIGS. 5-12, the sub-collector region 160 can comprise a semiconductor region having a higher concentration of the second conductivity type dopant than either the first semiconductor well or the second semiconductor layer. This sub-collector region with a very high doping concentration can further degrade the vertical bipolar current gain, providing a very low resistance shunt back to the first semiconductor well (n-well) so as to further prevent latchup from occurring.

Figure 13:
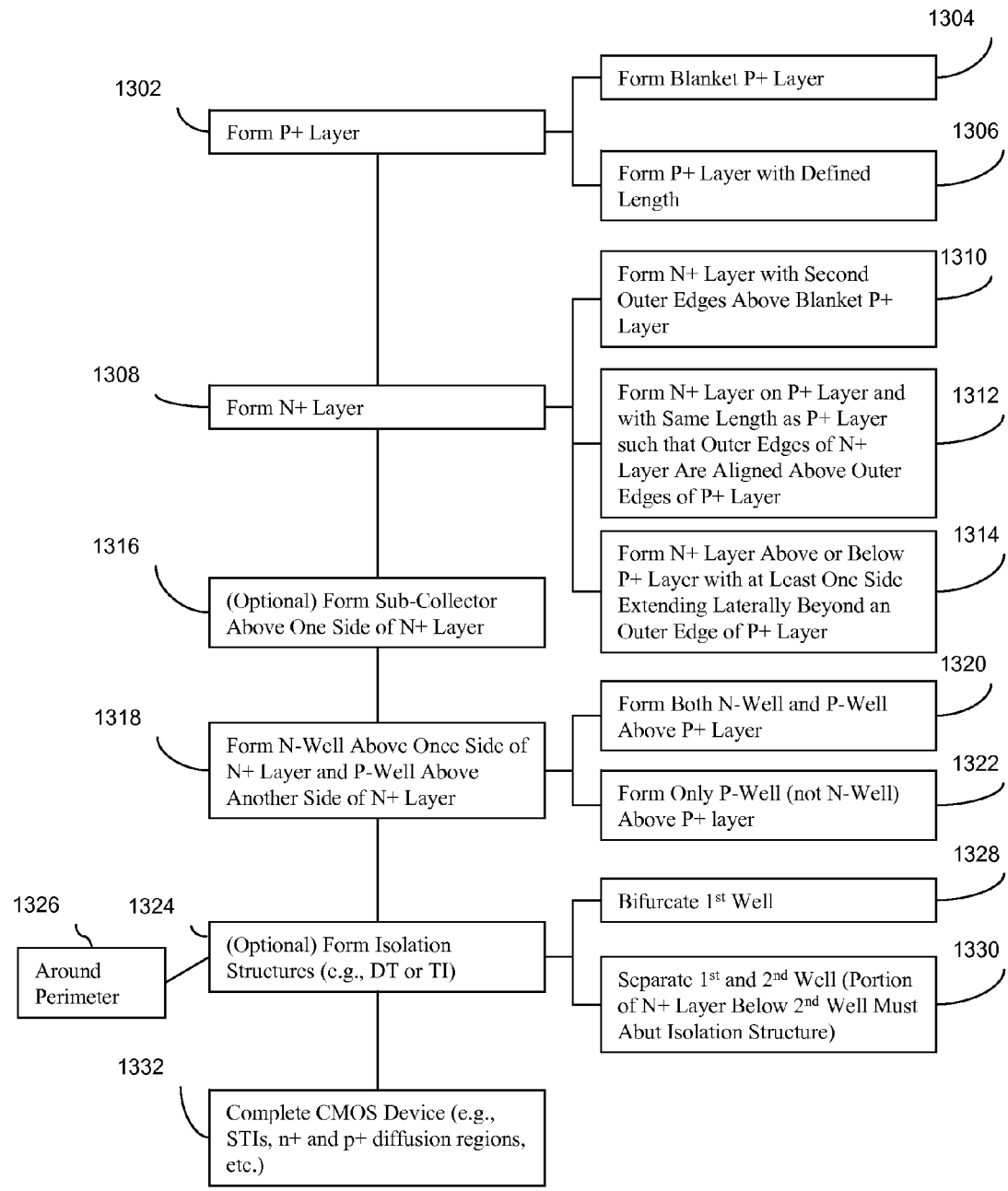
FIG. 13 is a flow diagram illustrating an embodiment of the method of the invention.

Referring to FIG. 13, embodiments of the method of forming the triple well CMOS device with the required and optional features described above comprise forming above a substrate with a first type conductivity both a first semiconductor layer with the first conductivity type (e.g., a buried p+ layer) type (e.g., a p− substrate) (1302) and a second semiconductor layer with a second conductivity type (e.g., a buried n+ layer) (1308). A first semiconductor well with the second conductivity type (e.g., an n-well) is formed above one side of the second semiconductor layer and second semiconductor well with the first conductivity type (e.g., a p-well) is formed above a second side of the second semiconductor layer adjacent to the first semiconductor well (1318). The above-mentioned buried layers and wells with differing conductivity types may be formed using well-known deposition, implantation and/or out-diffusion techniques. P-type wells and layers may be doped with appropriate levels of Boron. N-type wells and layers may be doped with appropriate levels of Phosphorus, Arsenic, or Antimony.

More particularly, referring to FIG. 2, the first semiconductor layer 202 can be formed (at process 1302) with a defined length such that it has first outer edges 222 (1306). The second semiconductor layer 203 can be formed (at process 1308) above the first semiconductor layer and with the same defined length such that it has second outer edges 223 that are aligned directly above the first outer edges 222 (1312). Thus, when the first and second semiconductor wells 211 and 212 are both formed above the second semiconductor layer 203 (at process 1318), they are also both formed above the first semiconductor layer 202 (1320).

Similarly, referring to FIG. 3, the first semiconductor layer 302 can be formed (at process 1302) as a blanket layer (1304). The second semiconductor layer 303 can be formed (at process 1308) above the first semiconductor layer and with defined dimensions (e.g., a defined length) such that it has second outer edges 323 that are above the blanket layer 303 (1310). Thus, as with the embodiment described above, when the first and second semiconductor wells 311 and 312 are both formed above the second semiconductor layer 303 (at process 1318), they are also both formed above the first semiconductor layer 302 (1320).

Referring to FIGS. 4a-b, the first semiconductor layer 402 and the second semiconductor layer 403 may be formed (at process 1302 and 1308) such that the first semiconductor layer 402 is either above or below the second semiconductor layer 403 relative to the substrate 401. Regardless of the relative positioning of the first and second semiconductor layers 402 and 403, the first semiconductor layer 402 can be formed (at process 1306) with a defined length such that is has first outer edges 422a-b (1306) and the second semiconductor layer 403 can be formed (at process 1308) such that at least one side 443 of the second semiconductor layer 403 extends laterally beyond at least one of the first outer edges (e.g., 422a). Then, when the wells 411 and 412 are subsequently formed above the second semiconductor layer 403 (at process 1318), the first semiconductor well 411 is formed over the side 443 that extends laterally beyond the outer edge of the first semiconductor layer 402. Thus, only the second semiconductor well 412 and not the first semiconductor well 411 is formed above the first semiconductor layer 402 (1322).

Additionally, the method can comprise forming an isolation structure that extends from the top surface of the device to below an upper surface of the second semiconductor layer such that it eliminates all lateral devices (e.g., lateral npn, pnp, or pnpn devices) and, thereby, improves latchup robustness (1324, see FIGS. 5-12). The isolation structure can be formed such that it bifurcates the first semiconductor well (1328, see FIGS. 5-6 and 9-10). Alternatively, the isolation structure can be formed such that it separates the first semiconductor well and the second semiconductor well (1330, see FIGS. 7-8 and 11-12). If the isolation structure separates the first and second semiconductor wells, it must further be formed such that a portion of the second semiconductor layer below the second semiconductor well abuts the isolation structure in order to isolate the second well from the substrate.

The above-described isolation structure can be formed as a trench isolation structure (TI) (e.g., e.g., an insulator-filled trench such as a back end of line (BEOL) BPSG or PSG inter-level dielectric-filled trench) that extends from the top surface of the device to below an upper surface of the second semiconductor layer but above the level of the first semiconductor layer (see FIGS. 6, 8, 10 and 12, and the above discussion of trench isolation structure). Alternatively, the isolation structure can be formed as a deep trench isolation structure (DT) (e.g., an oxide or other insulator-lined trench filled with a semiconductor material, such as polysilicon) that extends from the top surface of the device just below the level of a shallow trench isolation structure (STI) into the substrate below the level of the first semiconductor layer (see FIGS. 5, 7, 9 and 11 and above discussion of deep trench isolation structure (DT)). Well-known techniques may be used to form such DT or TI structures.

The method can also comprise forming an additional isolation structure 352, 452 around a perimeter of the device (1326, see FIGS. 5-12). The additional isolation structure can be formed simultaneously with the forming of the above-described isolation structure (at process 1324) and can similarly be formed as either a trench isolation structure (TI) (see FIGS. 6, 8, 10 and 12) or deep trench isolation structure (DT) (see FIGS. 5, 7, 9 and 12), depending on the wafer technology used to form the device. This additional isolation structure 352, 452 can serve to isolate the device from other devices formed on the same substrate.

The method can also optionally comprise before forming the first semiconductor well, forming a sub-collector region 360,460 with the second conductivity type above the second semiconductor layer and then, forming the first semiconductor well so that it is aligned above the sub-collector region (1316, see FIGS. 5-12). Specifically, the sub-collector region 360, 460 can be formed by implanting a region above the second semiconductor layer with a higher concentration of the second conductivity type dopant than either the second semiconductor layer 303, 403 or the subsequently formed first semiconductor well 311, 411. This sub-collector region with a very high doping concentration can further degrade the vertical bipolar current gain and provide a very low resistance shunt back to the first semiconductor well (n-well) so as to further prevent latchup from occurring.

Lastly, the method can comprise completing the CMOS device formation process. For example, referring to FIGS. 2-4*a-b*, a first n+ diffusion region 161 and a first p+ diffusion region 162 can be formed above the first semiconductor well and a second n+ diffusion region 163 and a second p+ diffusion region 164 can be formed above the second semiconductor well. The first n+ diffusion region 161 can be formed as a contact to the n-well. The first p+ diffusion region 162 can be formed as any p+ device, e.g., a p+ diode, a p-FET, a bipolar transistor, a p-doped resistor, etc. The second n+ diffusion region 163 can be formed as any n+ device, e.g., an n+ diode, an n-FET, a bipolar transistor, an n-doped resistor, etc. The second p+ diffusion region 164 can be formed as a contact to the p-well 212, 312, 412. Additionally, shallow trench isolation structures (STI) 170 can be formed to isolate each of the diffusion regions 161-164.

Therefore, disclosed above is a CMOS device structure that establishes a triple well, compensates for threshold voltage scattering, improves latchup robustness, establishes a high well-substrate capacitor, provides low resistance in the substrate and shields the n+ buried layer from minority carrier injection, external latchup and SER issues. Specifically, this triple well CMOS device structure addresses the issue of latchup by adding an n+ buried layer not only beneath the p-well to isolate the p-well from the p– substrate but also beneath the n-well. The n+ buried layer degrades the vertical pnp bipolar current gain and lowers n-well contact to p+ device shunt resistance. The structure eliminates the spacing issues between the n-well and n+ buried layer by extending the n+ buried layer below the entire device. The structure also addresses the issue of threshold voltage scattering by providing a p+ buried layer below the entire device under the n+ buried layer or below the p-well side of the device either under or above the n+ buried layer. Latchup robustness can further be improved by incorporating into the device an isolation structure that either bifurcates the first n-well or separates n-well and the p-well so as to eliminate lateral pnp, npn, or pnpn devices. Latchup robustness can also be improved by incorporating into the device a sub-collector region between the n+ buried layer and the n-well. Lastly, device performance can be improved by providing additional isolation structures around the device perimeter so as to isolate the device from other devices on the same substrate.

The foregoing description of the specific embodiments will so fully reveal the general nature of the invention that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments of the invention have been described in terms of preferred embodiments, those skilled in the art will recognize that the embodiments of the invention can be practiced with modification within the spirit and scope of the appended claims.

REFERENCES

1. A. H. Johnston, "The Influence of VLSI Technology Evolution on Radiation-Induced Latchup in Space Systems," IEEE Transactions on Nuclear Science, Vol. 43, 1996, pp. 505-521.
2. G. Brugier and J-M. Palau, "Single Particle-Induced Latchup, IEEE Transaction on Nuclear Science, Vol. 43, 1996, pp. 522-532.
3. J. Barak, J. Levinson, A. Akkerman, M. Hass, M. Victoria, A. Zentner, D. David, O. Even, and Y. Lfishitz, "A New Approach to the Analysis of SEU and SEL Data to Obtain the Sensitive Volume Thickness," IEEE Transactions on Nuclear Science, Vol. 43, pp. 907-911, 1996.
4. B. E. Fischer, M. Schlogl, J. Barak, E. Adler, and S. Metzger, "Simulataneous Imaging of Upsets and Latchup Sensitive Regions of a Static RAM, Nuc. Instrumentation and Methods in Phys Res. B, Vol. 130 1997, pp. 478-485.
5. J. Levinson, A. Akkerman, M. Victoria, M. Hass, D. Ilberg, M. Alluralde, R. Henneck, and Y. Lifshitz, "New Insight into Proton-Induced Latchup: Experiment and Modeling," Applied Physics Letters, Vol. 63, 1993, pp. 2952-2954.
6. P. Foulliat, H. Lapuyade, A. Touboul, J. P. Dom, and R. Gaillard, "Numerical Modelling of Mechanisms Involved in Latchup Triggering by Laser Beam," IEEE Transactions on Nuclear Science, Vol. 43, 1996, pp. 944-951.
7. J. Barak, E. Adler, B. E. Fischer, M. Schlogl, and S. Metzger, "Microbeam Mapping of Single Event Latchups and Single Event Upset in CMOS SRAMs," IEEE Transactions on Nuclear Science, Vol. 45, No. 3, June 1998, pp. 1595-1602.
8. Intel Corporation, "Cable Discharge Event in Local Area Network Environment," White Paper, Order No: 249812-001, July 2001.

9. R. Brooks, "A Simple Model for the Cable Discharge Event," IEEE802.3 Cable-Discharge Ad-hoc, March 2001.
10. Telecommunications Industry Association (TIA), Category 6 Cabling: Static Discharge Between LAN Cabling and Data Terminal Equipment, Category 6 Consortium, December 2002.
11. J. Deatherage, D. Jones, "Multiple factors trigger discharge events in Ethernet LANs" Electronic Design, Vol. 48, No. 25, Dec. 4, 2000, pp. 111-116.
12. D. Pommeranke, Charged Cable Event, Feb. 23, 2001.
13. A. Weger, S. Voldman, F. Stellari, P. Song, P. Sanda, and M. McManus, "A Transmission Line Pulse (TLP) Picosecond Imaging Circuit Analysis (PICA) Methodology for Evaluation of ESD and Latchup," Latchup Session, in Proceedings of the International Reliability Physics Symposium, May 2003, pp. 99-104.
14. S. Voldman, "A Review of CMOS Latchup and Electrostatic Discharge (ESD) in Bipolar Complimentary MOSFET (BiCMOS) Silicon Germanium Technologies: Part II-Latchup," Invited Paper, Journal of Microelectronics and Reliability, to be published 2005.
15. J. Mechler, C. Brennan, J. Massucco, R. Rossi, and L. Wissel, "Contention Latchup," Latchup Session, Proceedings of the International Reliability Physics Symposium, 2004, pp. 126-129.

What is claimed is:

1. A complementary metal oxide semiconductor device comprising:
   a substrate with a first conductivity type;
   a first semiconductor layer with said first conductivity type above said substrate, wherein first semiconductor layer is doped with a higher concentration of a first conductivity type dopant relative to said substrate;
   a second semiconductor layer with a second conductivity type different from said first conductivity type between said substrate and said first semiconductor layer, wherein said first semiconductor layer and said second semiconductor layer each have defined outer edges and wherein said second semiconductor layer is longer than said first semiconductor layer and extends laterally beyond said defined outer edges of said first semiconductor layer; and
   a first semiconductor well with said second conductivity type above said second semiconductor layer and not above said first semiconductor layer such that vertical bipolar current gain is degraded; and
   a second semiconductor well with said first conductivity type adjacent to said first semiconductor well and above both said first semiconductor layer and said second semiconductor layer so as to both compensate for threshold voltage scattering and isolate said second semiconductor well from said substrate, wherein said second semiconductor well and said first semiconductor layer are aligned and have approximately equal lengths.

2. The device of claim 1, all the limitations of which are incorporated herein by reference, further comprising an isolation structure that extends from a top surface of said device to below an upper surface of said second semiconductor layer.

3. The device of claim 2, all the limitations of which are incorporated herein by reference, wherein said isolation structure further extends into said substrate.

4. The device of claim 2, all the limitations of which are incorporated herein by reference, wherein said isolation structure bifurcates said first semiconductor well.

5. The device of claim 2, all the limitations of which are incorporated herein by reference, wherein said isolation structure separates said first semiconductor well and said second semiconductor well and wherein a portion of said second semiconductor layer below said second semiconductor well abuts said isolation structure.

6. The device of claim 1, all the limitations of which are incorporated herein by reference, further comprising a subcollector region with said second conductivity type between said first semiconductor well and said second semiconductor layer.

7. The device of claim 1, all the limitations of which are incorporated herein by reference, wherein said first semiconductor layer and said second semiconductor layer are not electrically biased.

8. A complementary metal oxide semiconductor device comprising:
   a p− substrate;
   a p+ semiconductor layer above said substrate;
   an n+ semiconductor layer above said substrate and one of above said p+ layer and below said p+ layer, wherein said p+ semiconductor layer and said n+ semiconductor layer each have defined outer edges and wherein said n+ semiconductor layer is longer than said p+ semiconductor layer and extends laterally beyond said defined outer edges of said p+ semiconductor layer; and
   an n-well above said n+ semiconductor layer and not above said p+ layer; and
   a p-well adjacent to said n-well and above both said n+ semiconductor layer and said p+ semiconductor layer, wherein said p-well and said p+ semiconductor layer are aligned and have approximately equal lengths, wherein below said n-well said n+ semiconductor layer degrades vertical bipolar current gain and wherein below said p-well said n+ semiconductor layer isolates said p-well from said p− substrate and p+ semiconductor layer compensates for threshold voltage scattering.

9. The device of claim 8, all the limitations of which are incorporated herein by reference, further comprising an isolation structure that extends from a top surface of said device to below an upper surface of said second semiconductor layer.

10. The device of claim 9, all the limitations of which are incorporated herein by reference, wherein said isolation structure further extends into said substrate.

11. The device of claim 9, all the limitations of which are incorporated herein by reference, wherein said isolation structure bifurcates said first semiconductor well.

12. The device of claim 9, all the limitations of which are incorporated herein by reference, wherein said isolation structure separates said first semiconductor well and said second semiconductor well and wherein a portion of said second semiconductor layer below said second semiconductor well abuts said isolation structure.

13. The device of claim 9, all the limitations of which are incorporated herein by reference, further comprising a subcollector region with said second conductivity type between said first semiconductor well and said second semiconductor layer.

14. The device of claim 8, all the limitations of which are incorporated herein by reference, wherein said n+ semiconductor layer and said p+ semiconductor layer are not electrically biased.

* * * * *